US008502250B2

(12) United States Patent
Lin et al.

(10) Patent No.: US 8,502,250 B2
(45) Date of Patent: Aug. 6, 2013

(54) LIGHT EMITTING DIODE PACKAGE AND LIGHT EMITTING DIODE MODULE

(75) Inventors: Ming-Te Lin, Taipei County (TW); Ming-Yao Lin, Taipei County (TW); Sheng-Chieh Tai, Taichung County (TW); Chih-Hsuan Liu, Hsinchu County (TW); Kuang-Yu Tai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 232 days.

(21) Appl. No.: 12/980,358

(22) Filed: Dec. 29, 2010

(65) Prior Publication Data

US 2011/0284879 A1 Nov. 24, 2011

Related U.S. Application Data

(60) Provisional application No. 61/346,703, filed on May 20, 2010.

(51) Int. Cl.
*H01L 33/60* (2010.01)
*H01L 33/08* (2010.01)

(52) U.S. Cl.
USPC .............................. 257/98; 257/99

(58) Field of Classification Search
USPC ..................... 257/88–103, E23.037, E33.057
See application file for complete search history.

(56) References Cited

U.S. PATENT DOCUMENTS

| | | | |
|---|---|---|---|
| 8,044,418 B2 * | 10/2011 | Loh et al. | 257/98 |
| 8,384,113 B2 * | 2/2013 | Kuo et al. | 257/98 |
| 2005/0073244 A1 | 4/2005 | Chou et al. | |
| 2007/0145397 A1 | 6/2007 | DenBaars et al. | |
| 2009/0162667 A1 | 6/2009 | Radkov | |
| 2009/0284969 A1 | 11/2009 | Chang | |
| 2010/0027270 A1 | 2/2010 | Huang et al. | |
| 2010/0134017 A1 | 6/2010 | Yatsuda et al. | |
| 2011/0215696 A1 | 9/2011 | Tong et al. | |
| 2011/0284879 A1 * | 11/2011 | Lin et al. | 257/88 |

OTHER PUBLICATIONS

Office Action of U.S. counterpart application issued on Oct. 22, 2012, p. 1-p. 11.
Notice of Allowance of U.S. counterpart application issued on Mar. 4, 2013, p. 1-p. 12.

* cited by examiner

*Primary Examiner* — Cuong Q Nguyen
(74) *Attorney, Agent, or Firm* — Jianq Chyun IP Office

(57) ABSTRACT

A light emitting diode (LED) package comprising a carrier, an LED chip, a lens, and a phosphor layer is provided. The LED chip disposed on the carrier. The lens encapsulating the LED chip has a plurality of fins surrounding the LED chip and a conical indentation. The fins extending backward the LED chip radially. Each of the fins has at least one light-emitting surface and at least one reflection surface adjoining the light-emitting surface. A bottom surface of the conical indentation is served as an total reflection surface. The phosphor layer is disposed on the light-emitting surfaces of the lens. An LED package and an LED module are also provided.

8 Claims, 8 Drawing Sheets

LIGHT EMITTING DIODE PACKAGE AND LIGHT EMITTING DIODE MODULE

CROSS-REFERENCE TO RELATED APPLICATION

This application claims the priority benefit of U.S. provisional application Ser. No. 61/346,703, filed on May 20, 2010. The entirety of the above-mentioned patent application is hereby incorporated by reference herein and made a part of this specification.

TECHNICAL FIELD

The present application relates to a light emitting diode (LED) package and an LED module. More particularly, the present application relates to an LED package and an LED module with favorable light-emitting efficiency.

BACKGROUND

Due to the advantages of long lifetime, small size, low heat emission, and low power consumption, LEDs have been widely applied in various home appliances and instruments as indicators or light sources. With recent development towards multicolor and high illumination, the applications of the LEDs are extended to large-sized outdoor billboards, traffic lights, etc. In the future, the LEDs may become the power-saving and environment-protecting light sources in replacement of tungsten filament lamps and mercury vapor lamps. LED chips are mainly made of compounds of groups III-V, for example, gallium phosphide (GaP), gallium arsenide (GaAs) or other semiconductor compounds. In order to enhance optical performance and reliability of LEDs, various package technologies for encapsulating LED chips are proposed.

SUMMARY

According to an embodiment, an LED package comprises a carrier, an LED chip, a lens, and a phosphor layer is provided. The LED chip disposed on the carrier. The lens encapsulating the LED chip has a plurality of fins surrounding the LED chip and a conical indentation. The fins extend backward the LED chip radially. Each of the fins has at least one light-emitting surface and at least one reflection surface adjoining the light-emitting surface. A bottom surface of the conical indentation serves as a total reflection surface.

According to another embodiment, an LED package comprises a carrier, an LED chip, a lens, and a patterned phosphor layer is provided. The LED chip disposed on the carrier. The lens encapsulating the LED chip has a plurality of sub-lens parts arranged in an array or a matrix. Each of the sub-lens parts has a conical indentation and at least one light-emitting surface adjoining an edge of the conical indentation. A bottom surface of the conical indentation serves as a total reflection surface. The patterned phosphor layer is disposed on the light-emitting surface, and the sub-lens parts are spatially apart from each other by the patterned phosphor layer.

According to an embodiment, an LED module comprises a housing, a plurality of LED packages, at least one lens, and a patterned phosphor layer is provided. The LED package disposed in the housing emits a light. The lens encapsulating the LED packages has a plurality of sub-lens parts arranged in an array or a matrix. Each of the sub-lens parts has a conical indentation and at least one light-emitting surface adjoining an edge of the conical indentation. A bottom surface of the conical indentation serves as an total reflection surface.

DETAILED DESCRIPTION

Figure 1:
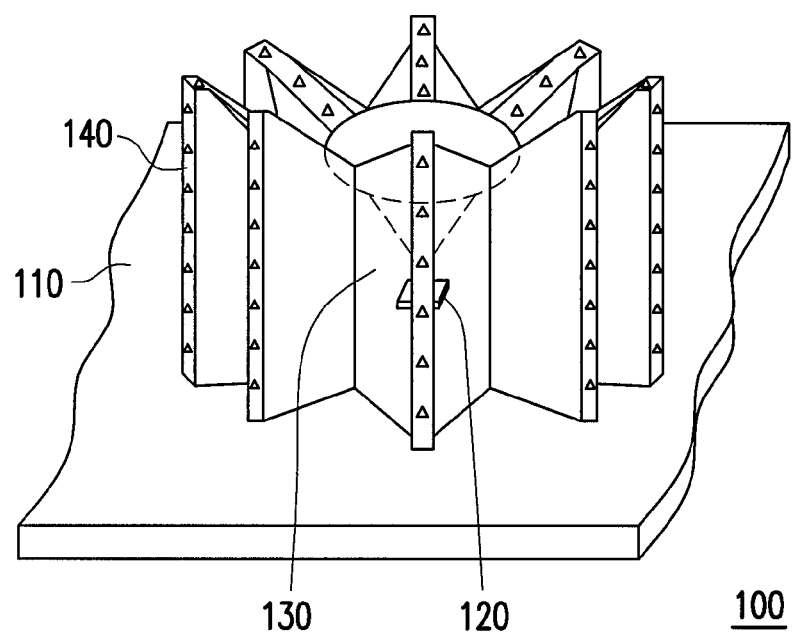
FIG. 1 is a perspective view schematically illustrating an LED package according to an embodiment of the present application.
Figure 2:
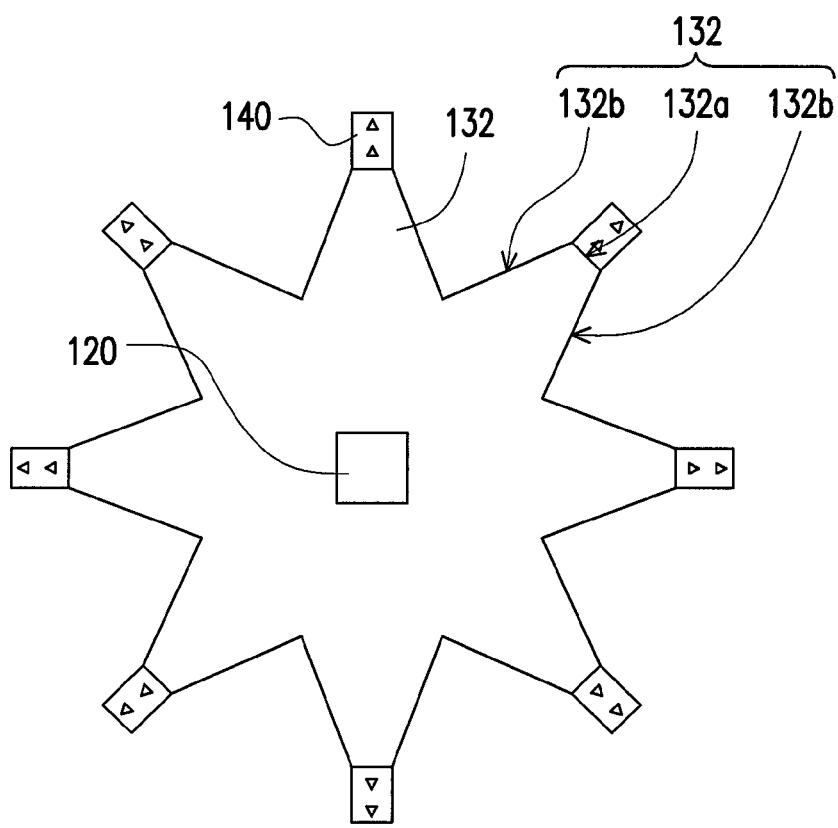
FIG. 2 is a top view of the LED package in FIG. 1.
Figure 3:
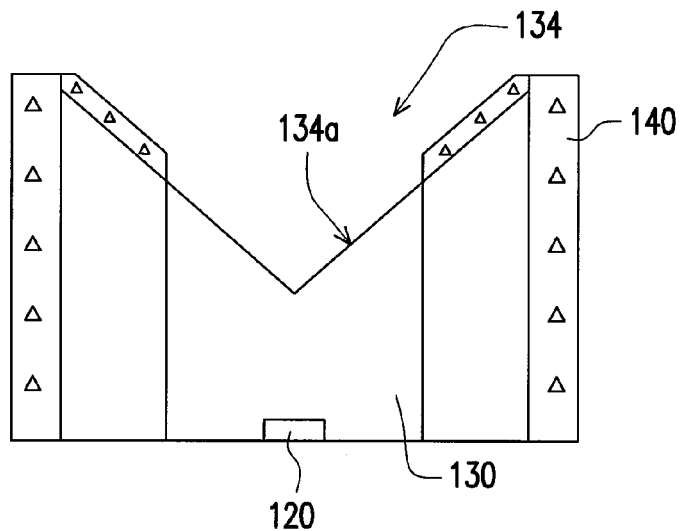
FIG. 3 is a cross-sectional view of the LED package in FIG. 1.

FIG. 1 is a perspective view schematically illustrating an LED package according to an embodiment of the present application. FIG. 2 is a top view of the LED package in FIG. 1. FIG. 3 is a cross-sectional view of the LED package in FIG. 1. Referring to FIGS. 1 through 3, an LED package 100 of the present embodiment comprises a carrier 110, an LED chip 120, a lens 130, and a phosphor layer 140. The LED chip 120 disposed on the carrier 110 and electrically connected to the carrier 110. In the present embodiment, the carrier 110 is a lead frame, for example, such that the LED chip 120 is capable of being mounted thereon. When the LED chip 120 receives a driving current transmitted by the carrier 110, the LED chip 120 emits a light with predetermined wavelength.

The lens 130 that is bonded with the carrier 110 and encapsulates the LED chip 120 has a plurality of fins 132 surrounding the LED chip 120. The fins 132 extend backward the LED chip 120 radially. Each of the fins 132 has a light-emitting surface 132a and a pair of reflection surfaces 132b adjoining the light-emitting surface 132a. The pair of reflection surfaces 132b are located at two opposite sides of the first light-emitting surface 132a, and an included angle of one of the reflection surfaces 132b and the light-emitting surface 132a is substantially equal to an included angle of the other one of the reflection surfaces 132b and the light-emitting surface 132a. The phosphor layer 140 is disposed on the light-emitting surfaces 132a of the fins 132. For most the light emitted from the LED chip 120 and propagating toward the reflection surfaces 132b, the reflection surfaces 132b of the fins 132 serve as total reflection surfaces. Therefore, parts of the light emitted from the LED chip 120 propagate toward the light-emitting surfaces 132a, and other parts of the light propagating toward the reflection surfaces 132b are reflected by the reflection surfaces 132b so as to pass through the light-emitting surfaces 132a of the fins 132.

In the present embodiment, the phosphor layer 140 on the light-emitting surfaces 132a is irradiated and excited by the light propagating toward the light-emitting surfaces 132a.

For example, the light emitted from the LED chip 120 is a blue light. After the phosphor layer 140 is irradiated and excited by the light emitted from the LED chip 120, a secondary light (e.g. yellow light) with a wavelength which is different from that of the light emitted from the LED chip 120. The light emitted from the LED chip 120 and the secondary light generated by the phosphor layer 140 are mixed and a white light is obtained. In the present embodiment, wavelength of the light emitted from the LED chip 120 and wavelength of the secondary light generated by the phosphor layer 140 are not strictly limited in the present embodiment. In order to facilitate excitation of the phosphor layer 140 and generate the secondary light successfully, wavelength of the light emitted from the LED chip 120 should be less than that of the secondary light.

In the present embodiment, the lens 130 may further comprise a conical indentation 134, and the vertex of the conical indentation 134 is located above a center of the LED chip 120. The phosphor layer 140 is in the form of a plurality of stripe patterns disposed on the light-emitting surfaces 132a of the fins 132, and each of the stripe patterns further extends on a bottom surface 134a of the conical indentation 134. For most the light emitted from the LED chip 120 and propagating toward the bottom surface 134a, the bottom surface 134a of the conical indentation 134 serves as a total reflection surface. Therefore, parts of the light emitted from the LED chip 120 and propagating toward the bottom surface 134a of the conical indentation 134 are reflected back to the light-emitting surfaces 132a of the fins 132. Though the curvature of the bottom surface 134a depicted in FIG. 3 is constant, the bottom surface 134a of the conical indentation 134 is not limited to be a single-curvature surface in the present application. In other embodiments, the conical indentation has a plurality of bottom surfaces with different curvatures such that light emitted from the LED chip 120 can be reflected by the bottom surfaces more efficiently.

Accordingly, in the LED package 100, the amount of light emitted from the light-emitting surface 132a of the fins 132 is increased due to the light being reflected by the reflection surfaces 132b of the fins 132 and the bottom surface 134a of the conical indentation 134. In this way, the light-emitting efficiency of the LED package 100 is enhanced and the amount of the phosphor layer required to be coated on the light-emitting surface 132a is reduced.

Figure 4:
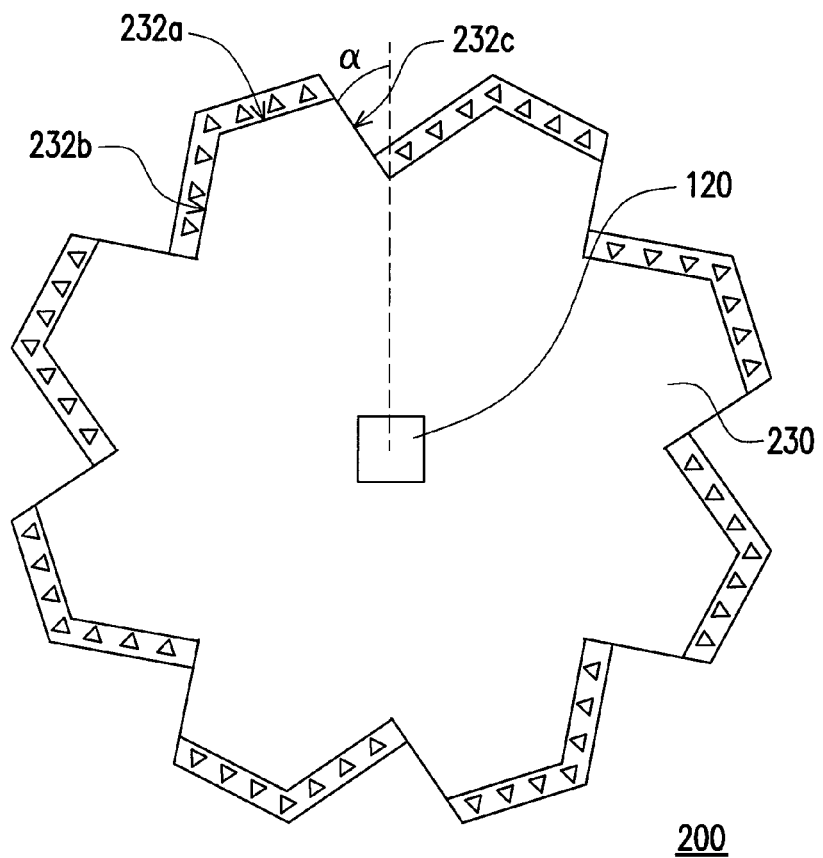
FIG. 4 is a cross-sectional view of an LED package according to another embodiment of the present application.

FIG. 4 is a cross-sectional view of an LED package according to another embodiment of the present application. Referring to the FIG. 4, the difference between FIG. 4 and the above-mentioned embodiment (FIG. 1 through FIG. 3) is that each of the fins 232 has one first light-emitting surface 232a, one second light-emitting surface 232b and one reflection surface 232c, wherein the reflection surface 232c and the second light-emitting surface 232b adjoin the first light-emitting surface 232a, and the reflection surface 232c and the second light-emitting surface 232b are located at two opposite sides of the first light-emitting surface 232a. An included angle of the first light-emitting surface 232a and the second light-emitting surface 232b is unequal to an included angle of the first light-emitting surface 232a and the reflection surface 232c. In this way, the light-emitting surfaces 232a the lens 230 is relatively large so as to obtain favorable light-emitting efficiency of the LED package 200. In the present embodiment, the angle α for the reflection surface 232c is obtained in "Ring Remote Phosphor Structure for Phosphor-Converted White LEDs" (IEEE PHOTONIC TECHNOLOGY LETTERS, VOL. 22, NO. 8, APRIL 15, 2101).

Figure 5:
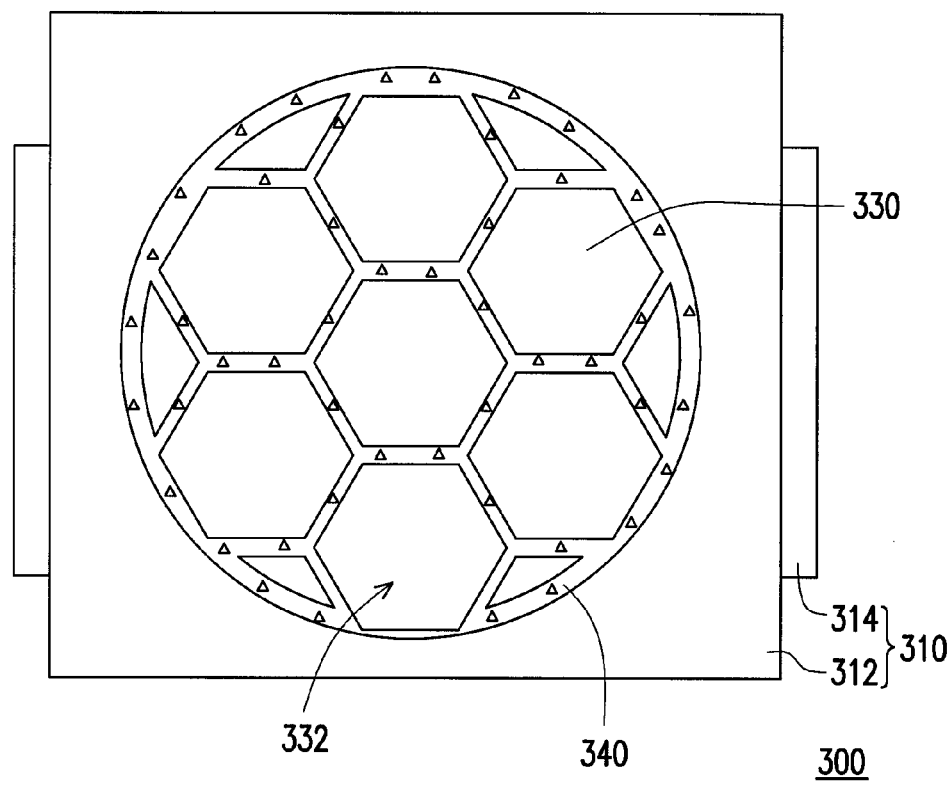
FIG. 5 is a top view of an LED package according to yet another embodiment of the present application.
Figure 6:
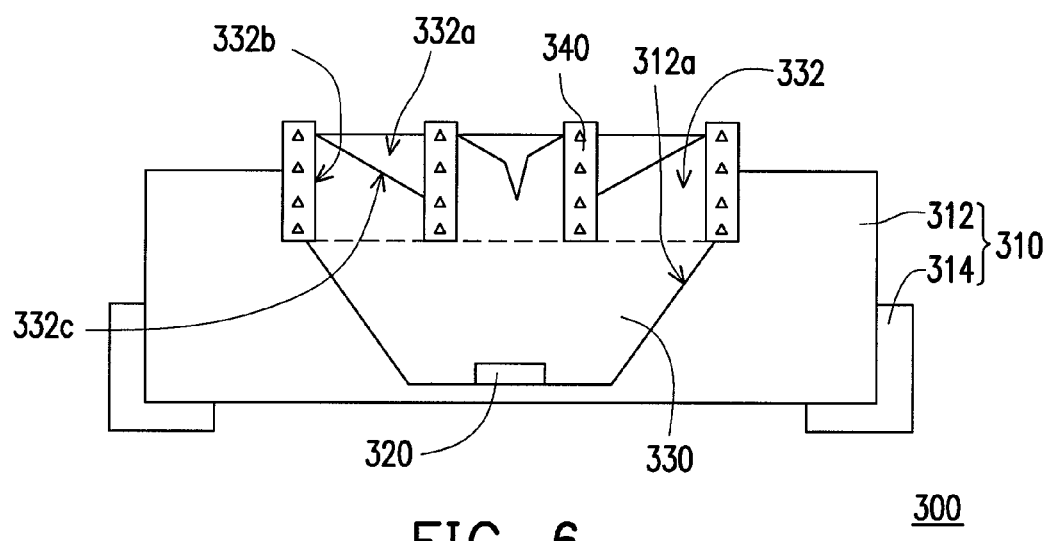
FIG. 6 is a cross-sectional view of the LED package in FIG. 5.
Figure 7A:
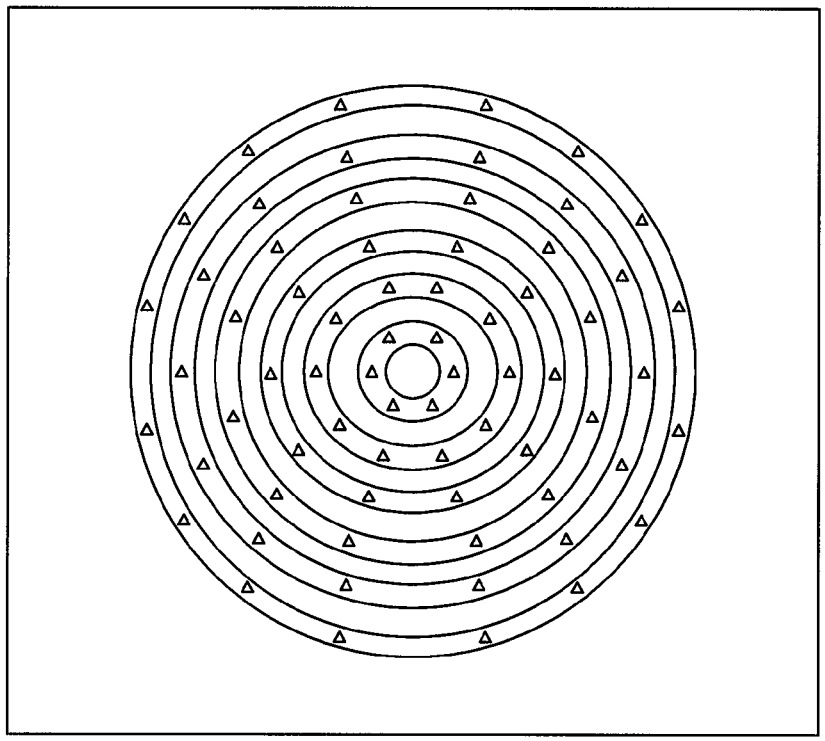
FIGS. 7A, 7B, 8A, 8B, 9A, and 9B are the top views and the side views of LED package separately in different embodiments of the present application.
Figure 7B:
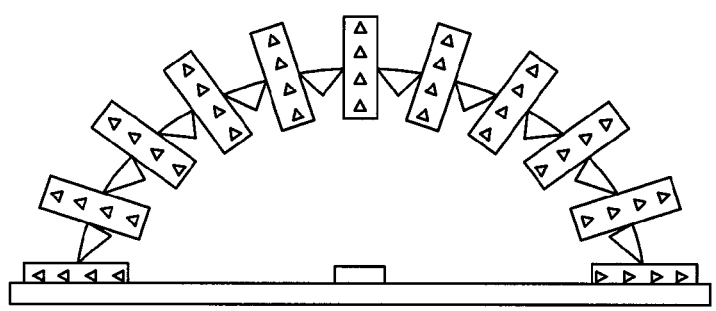
Figure 8A:
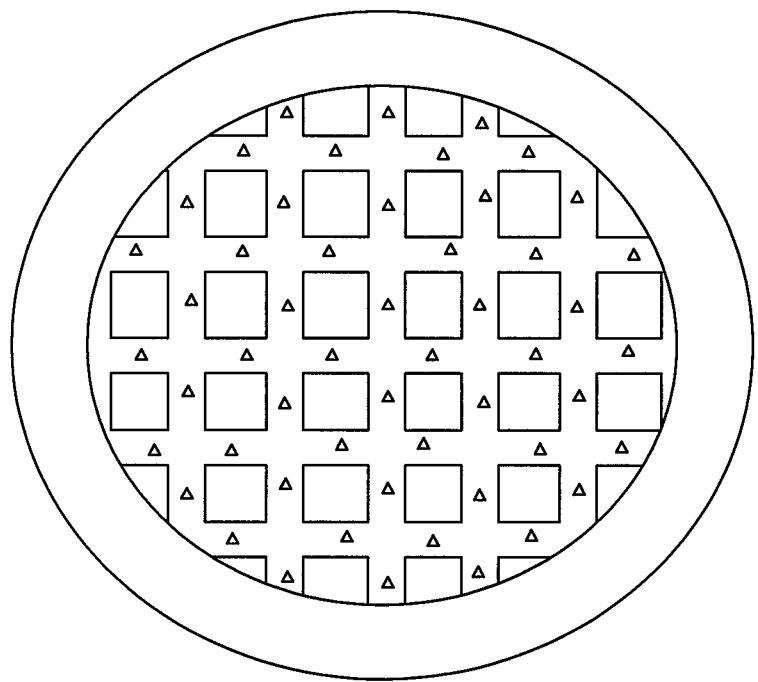
Figure 8B:
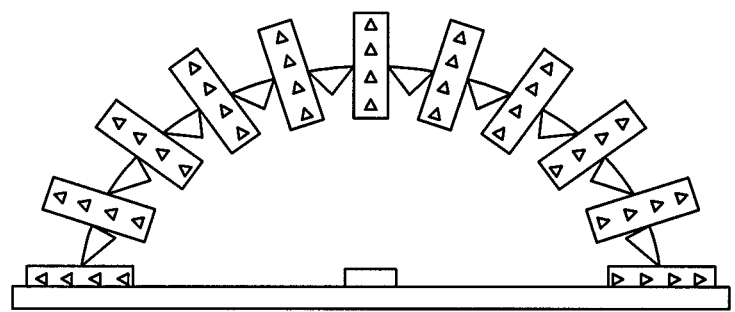
Figure 9A:
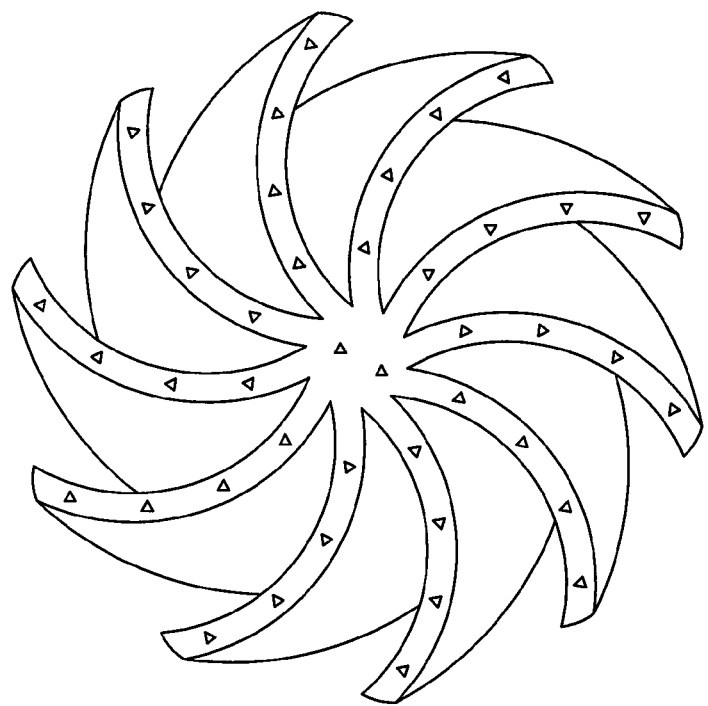
Figure 9B:
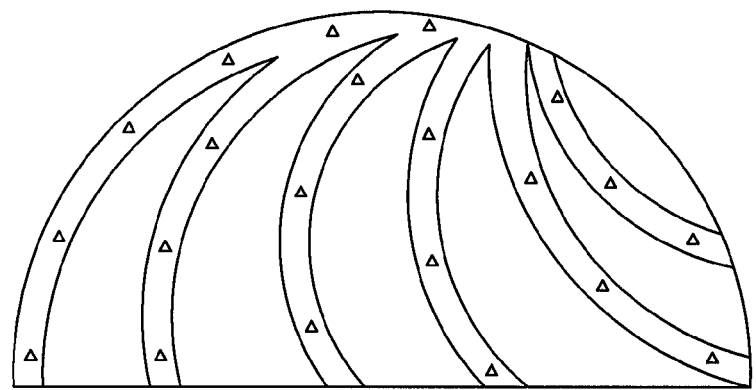

FIG. 5 is a top view of an LED package according to yet another embodiment of the present application. FIG. 6 is a cross-sectional view of the LED package in FIG. 5. Referring to FIG. 5 and FIG. 6, the LED package 300 of the present embodiment comprises a carrier 310, an LED chip 320, a lens 330, and a patterned phosphor layer 340. The LED chip 320 disposed on the carrier 310 and electrically connected to the carrier 310 is used for emitting a light. Since the carrier 310 and the LED chip 320 are the same with the carrier 110 and the LED chip 120 described above, a relevant description thereof is omitted. In the present embodiment, the lens 330 is bonded with the carrier 310 and encapsulates the LED chip 320. In addition, the lens 330 has a plurality of sub-lens parts 332 arranged in an array or a matrix. Each of the sub-lens parts 332 has a conical indentation 332a and a plurality of light-emitting surface 332b adjoining an edge of the conical indentation 332a. For the light propagating toward the conical indentation 332a, the bottom surface 332c of the conical indentation 332a serves as a total reflection surface. The patterned phosphor layer 340 is disposed on the light-emitting surface 332b of the sub-lens parts 332, and the sub-lens parts 332 are spatially apart from each other by the patterned phosphor layer 340. In other words, the light propagating toward the bottom surfaces 332c of the conical indentations 332a of the sub-lens parts 332 are reflected thereby so as to pass through the light-emitting surfaces 332b of the sub-lens parts 332. The lens 330 having the sub-lens parts 332 arranged in array or a matrix may enhance the light-emitting efficiency of the LED package 300.

Referring to the FIG. 6, the carrier 310 of the present embodiment comprises a reflective member 312 and a lead frame 314. The reflective member 312 has a accommodating space 312a for accommodating the LED chip 320 and at least parts of the lens 330. Parts of the light propagating toward the reflective member 312 are reflected back to the light-emitting surfaces 332b, and other parts of the light propagating toward the reflective member 312 are reflected back to the bottom surfaces 332c of the conical indentations 332a of the sub-lens parts 332.

As shown in FIG. 5, the patterned phosphor layer 340 has a symmetric pattern on the lens 330. For example, the patterned phosphor layer 340 of the embodiment is a phosphor layer with honeycomb pattern. But the pattern of the patterned phosphor layer 340 is not limited in the present application. FIGS. 7A, 7B, 8A, 8B, 9A, and 9B are the top views and the side views of LED package in different embodiments of the present application. In these embodiments, the patterned phosphor layer includes a plurality of concentric circular phosphor patterns in FIGS. 7A and 7B. The patterned phosphor layer is a meshed phosphor layer in FIGS. 8A and 8B. The patterned phosphor layer is a phosphor layer with vortex pattern in FIGS. 9A and 9B.

Figure 10:
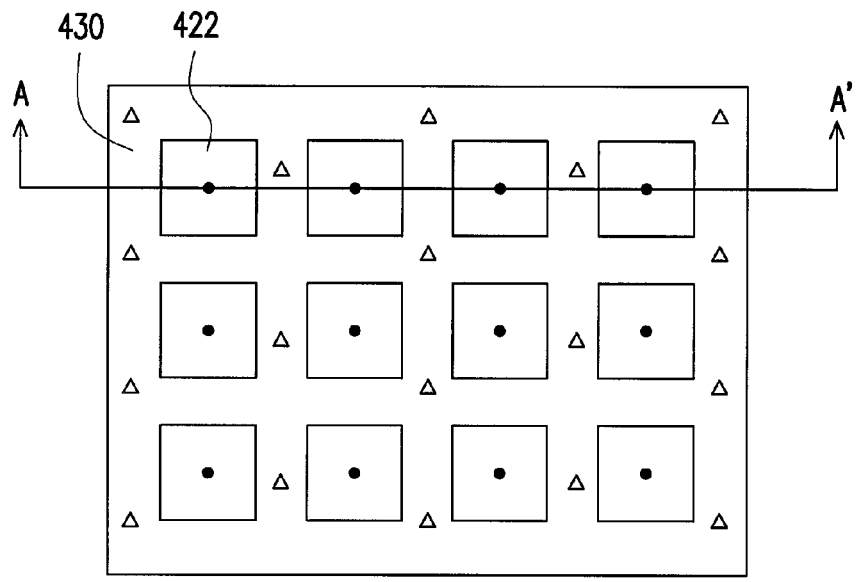
FIG. 10 is a top view of an LED module according to an embodiment of the present application.
Figure 11:
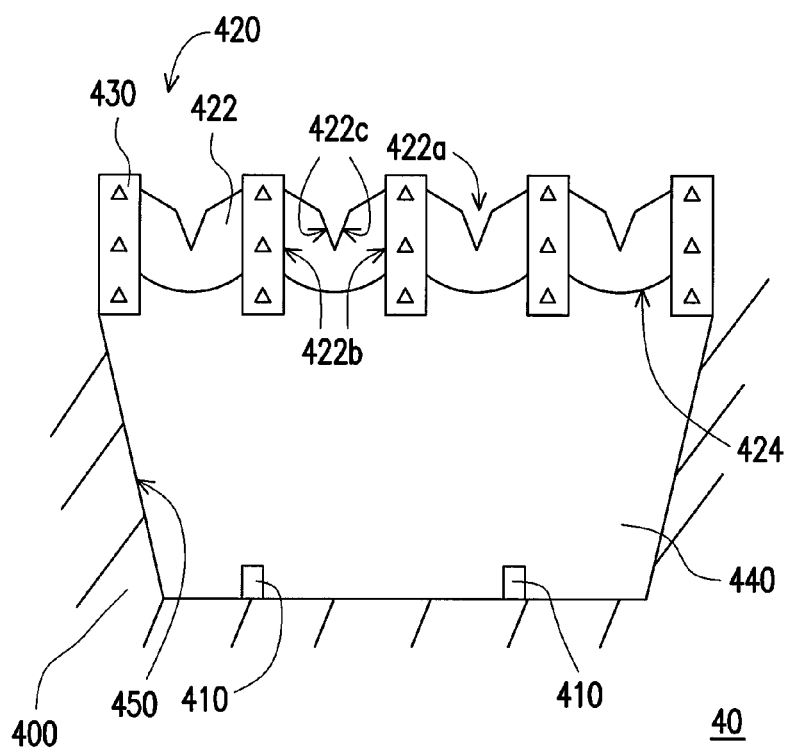
FIG. 11 is a cross-sectional view of the LED module in FIG. 10.

FIG. 10 is a top view of an LED module according to an embodiment of the present application. FIG. 11 is a cross-sectional view of the LED module in FIG. 10. Referring the FIGS. 10 and 11, the LED module 40 comprises a housing 400, a plurality of LED packages (or LED chips) 410, a lens 420, and a patterned phosphor layer 430. The LED packages 410 are disposed in the housing 400 and capable of emitting a light, wherein the LED packages 410 are the same with the LED packages described in above embodiments, so a relevant description thereof is omitted. The lens 420 is bonded with the housing 400 and encapsulates the LED packages 410. The lens 420 has a plurality of sub-lens parts 422 arranged in an array or a matrix. In addition, the sub-lens parts 422 are spatially apart from each other by the patterned phosphor layer 430. Each of the sub-lens parts 422 has a conical indentation 422a and a plurality of the light-emitting surfaces 422b adjoining an edge of the conical indentation 422a. For the light propagating to the bottom surface 422c of the conical indentation 422a, a bottom surface 422c of the conical indentation 422a serves as an total reflection surface such that the light propagating to the bottom surface 422c is reflected back to the light-emitting surfaces 422b and the patterned phosphor layer 430 on the light-emitting surfaces 422b can be excited. The housing 400 has a plurality of reflection surfaces 450, parts of the light propagating toward the reflection surfaces 450 are reflected back to the light-emitting surfaces 422b of the sub-lens parts 422, and other parts of the light propagating toward the reflection surface 450 are reflected back to the bottom surfaces 422c of the conical indentations 422a of the sub-lens parts 422, and then the light are reflected back to the light-emitting surfaces 422b. As the similar structure of the lens 310 described above, the lens 420 and the patterned phosphor layer 430 form a meshed and symmetric pattern of the present embodiments. In other alternative embodiments, the patterned phosphor layer is a plurality of concentric circular phosphor patterns, a phosphor layer with honeycomb pattern, or a phosphor layer with vortex pattern.

Besides, the lens 420 further comprises a plurality of light incident surfaces 424 being opposite to the bottom surfaces 422c of the conical indentations 422a of the sub-lens parts 422. In other words, the light incident surfaces 424 are located under the conical indentations 422a of the sub-lens parts 422. The light incident surfaces 424 of the present embodiment are convex surfaces, but shapes of the light incident surfaces 424 are not limited in the present application. In other alternative embodiments, the light incident surfaces are concave surface, or a plane that can be properly modified in accordance with the design requirements.

Referring to FIG. 11, the LED module 40 further comprises a medium 440 connected between the light incident surfaces 424 and the LED packages 410. The medium 440 is air, inert gas or other encapsulation material, for example, in the present embodiment whose index of refraction is different from the index of refraction of the lens 420. Specifically, the lens 420 and the medium 440 may be fabricated by different materials and an interface is formed there-between. The medium 440 directly encapsulates the LED packages (or LED chips) 410 and serves as a encapsulation.

Figure 12:
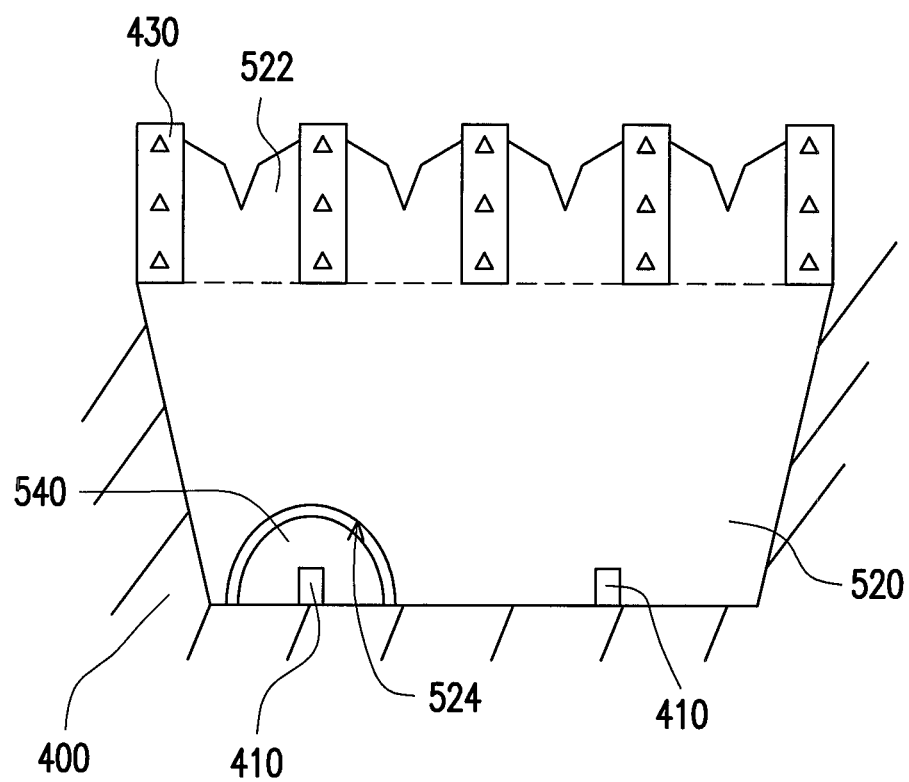
FIG. 12 is a cross-sectional view of an LED module according to still another embodiment of the present application.

FIG. 12 is a cross-sectional view of an LED module according to still another embodiment of the present application. The medium 540 is an optical clear encapsulation for encapsulating the LED packages. The lens 520 is assembled in the housing 400 to cover the medium 540 and the LED packages 410, and there exists an air gap between the incident surfaces 524 and the medium 540. For example, the lens 520 and the medium 540 may be fabricated by the same material and there is no interface formed there-between.

Referring to the foresaid embodiments, since the lens with sub-lens parts being spatially apart from each other by the patterned phosphor layer, the light-emitting efficiency of the LED package or the LED module is enhanced.

It will be apparent to those skilled in the art that various modifications and variations can be made to the structure of the present application without departing from the scope or spirit of the application. In view of the foregoing, it is intended that the present application covers modifications and variations of this application provided they fall within the scope of the following claims and their equivalents.

What is claimed is:

1. A light emitting diode (LED) package, comprising:
a carrier;
an LED chip, disposed on the carrier;
a lens, encapsulating the LED chip, the lens having a plurality of fins surrounding the LED chip and a conical indentation, the fins extending backward the LED chip radially, each of the fins having at least one light-emitting surface and at least one reflection surface adjoining the light-emitting surface, a bottom surface of the conical indentation serving as a total reflection surface; and
a phosphor layer, disposed on the light-emitting surfaces of the lens.

2. The LED package of claim 1, wherein the light propagating toward the reflection surface is reflected thereby to pass through the light-emitting surface of the lens.

3. The LED package of claim 1, wherein each of the fins has one light-emitting surface and a pair of reflection surfaces adjoining the light-emitting surface, wherein the pair of reflection surfaces are located at two opposite sides of the light-emitting surface.

4. The LED package of claim 1, wherein reflection surfaces of the fins are served as a total reflection surface.

5. The LED package of claim 1, wherein each of the fins has one first light-emitting surface, one second light-emitting surface and one reflection surface, the reflection surface and the second light-emitting surface adjoin the first light-emitting surface and are located at two opposite sides of the first light-emitting surface.

6. The LED package of claim 1, wherein the conical indentation has a plurality of bottom surfaces with different curvatures.

7. The LED package of claim 1, wherein the phosphor layer includes a plurality of stripe patterns disposed on the light-emitting surfaces of the fins.

8. The LED package of claim 1, wherein the patterned phosphor layer is a phosphor layer with vortex pattern.

* * * * *